United States Patent [19]

Soshea

[11] 3,790,868

[45] Feb. 5, 1974

[54] EFFICIENT RED EMITTING ELECTROLUMINESCENT SEMICONDUCTOR

[75] Inventor: Richard W. Soshea, Portola Valley, Calif.

[73] Assignee: Hewlett-Packard Company, Palo Alto, Calif.

[22] Filed: Oct. 27, 1972

[21] Appl. No.: 301,705

[52] U.S. Cl. ... 317/235 R, 317/235 N, 317/235 AC

[51] Int. Cl. ... H05b 33/00

[58] Field of Search ... 317/235 N, 235 AC

[56] References Cited

UNITED STATES PATENTS

| | | | |
|---|---|---|---|
| 3,748,480 | 7/1973 | Coleman | 250/211 J |
| 3,725,749 | 4/1973 | Groves | 317/235 R |
| 3,667,004 | 5/1972 | Kuhn | 317/235 R |
| 3,703,670 | 11/1972 | Kunz | 317/235 R |

OTHER PUBLICATIONS

Electronics, Mar. 4, 1968, page 109.

Nethercot, I.B.M. Technical Disclosure, Vol. 12, No. 11, April 1970, p. 1862.

*Primary Examiner*—Martin H. Edlow

*Attorney, Agent, or Firm*—A. C. Smith

[57] ABSTRACT

A solid state light source includes a gallium arsenide phosphide electroluminescent semiconductor in a mesa structure, a substrate substantially transparent to the radiation emitted by the semiconductor, a region of varying composition connecting the substrate to the semiconductor, and a reflective backing.

6 Claims, 2 Drawing Figures

EFFICIENT RED EMITTING ELECTROLUMINESCENT SEMICONDUCTOR

BACKGROUND OF THE INVENTION

Conventional light emitting diodes have had low luminous efficiencies because approximately 98 percent of the light generated at the junction of the diode is absorbed by the surrounding material. In such diodes, light generated at the P-N junction which goes downward is absorbed immediately, because the energy band gap of the substrate is lower than the energy band gap of the material in which the light is generated. Of that light emitted upward from the junction, most is reflected downward by the surface of the chip and consequently absorbed. This reflection occurs because the light impinges at an angle outside the cone angle of acceptance. The size of the cone angle of acceptance is a function of the difference in refractive index between the semi-conductor surface and the surrounding material. Thus only light generated upward which strikes the surface within the cone angle of acceptance can escape from a conventional semiconductor. Accordingly it is the principal objective of this invention to provide a more efficient light emitting diode.

SUMMARY OF THE INVENTION

The objective of providing a more efficient light emitting diode is accomplished, according to one embodiment of the invention, by a gallium arsenide phosphide diode of approximate composition $GaAs_{(1-x)}P_x$ $(0.3 \leq x \leq 0.5)$ and a transparent substrate for the semiconductor of GaP, $GaAs_{(1-x)}P_x$ $(x > 0.5)$ or any other material which does not absorb heavily at the wavelength of the light emitted by the junction. Typically, these materials are assembled in a mesa structure with a reflective backing. A region of graded composition separates the junction and the substrate to allow dissipation of strain caused by the differences in crystal lattice dimensions. The structure and materials of this invention allow light emitted at the P-N junction to travel throughout the chip and be reflected many times without significant attenuation. The reflective backing provides adequate ohmic contact while reflecting almost all of the light which strikes it.

DESCRIPTION OF THE PREFERRED EMBODIMENT

Figure 1:
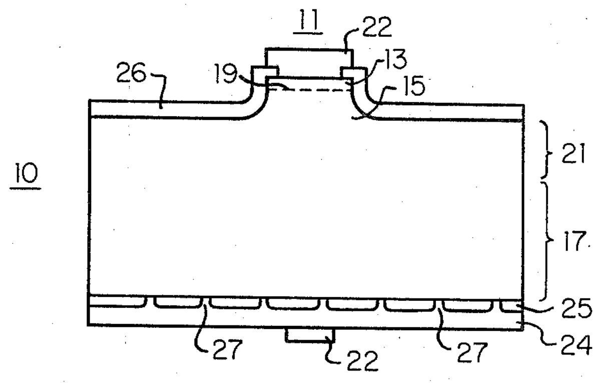
FIG. 1 is a cross-sectional view of the preferred embodiment of the high efficiency electroluminescent semiconductor.

Referring now to FIG. 1 there is shown a red-emitting electroluminescent semiconductor 10 composed of P-conductivity type gallium arsenide phosphide 13 and N-conductivity type gallium arsenide phosphide 15, the N-type layer being deposited by vapor phase deposition upon the material below. The approximate composition of this junction region 19 is $GaAs_{(1-x)}P_x$ $(0.3 \leq x \leq 0.5)$, while the composition of the substrate 17 is GaP, $GaAs_{(1-x)}P_x$ $(x > 0.5)$, or any other material which does not absorb radiation heavily at the wavelength emitted by the junction 19. A region 21 of varying composition separates the junction materials 13, 15 and the transparent substrate 17 to allow dissipation of strains caused by the change in crystal lattice structure between the junction 19 and the transparent substrate 17. When forward current is applied through the junction 19 via the electrodes 22, light is emitted whose wavelength is determined by the phosphorous concentration in the gallium arsenide phosphide at the junction. If the junction region is $GaAs_{.6}P_{.4}$ the light emitted will be of approximately 650 nm wavelength while if the junction is $GaAs_{.7}P_{.3}$ the light emitted will be of approximately 700 nm wavelength. Because the energy band gap of the graded region 21 and the substrate 17 is higher than that of the electroluminescent material 13 and 15, light passes without significant attenuation throughout the semiconductor 10.

To further improve the efficiency of the gallium arsenide phosphide electroluminescent semiconductor 10, a metal 24 which acts as a mirror may be deposited on the back surface of the semi-conductor. A dielectric 25 separates this backing 24 from the transparent substrate 17 except at occasional locations 27 where ohmic contact between the mirror 24 and the substrate 17 is desired. Similarly dielectric 26 protects and insulates the opposite surface of the chip.

Because the energy band gap of the light emitted from the junction is the same as the energy band gap of the junction materials, the gallium arsenide phosphide junction 19 not only produces light, but absorbs it. Thus, a light emitting diode of still higher efficiency can be created by employing a mesa structure 11 as shown in FIG. 1. The mesa structure 11 minimizes the amount of material with an energy band gap approximately that of the junction, in other words, the amount of gallium arsenide phosphide extraneous to the junction 19. Such a structure can be accomplished by etching or otherwise removing the surface material in the regions away from the junction 19. Because the junction absorbs light it is desirable to keep the size of the mesa 11 small with respect to the chip size.

Figure 2:
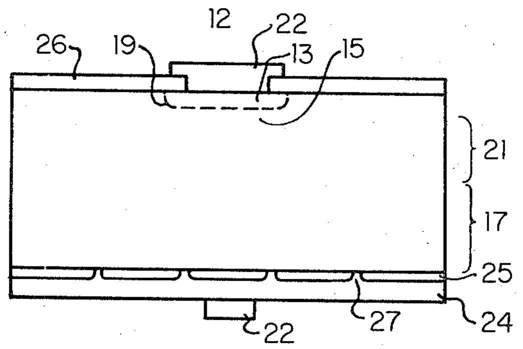
FIG. 2 is a cross-sectional view of an alternative embodiment of the invention.

FIG. 2, an alternative embodiment of the invention, shows a cross-sectional view of the semiconductor 10 prior to etching or the like. The embodiment shown in FIG. 2 has the advantage of being planar 12, however, the increased amount of gallium arsenide phosphide extraneous to the junction makes such a structure a less efficient light emitting semiconductor than that shown in FIG. 1.

I claim:

1. An electroluminescent semiconductor comprising:

a junction region of P-conductivity type semiconductor material contiguous with N-conductivity type semiconductor material, both semiconductor materials being composed of gallium arsenide phosphide wherein the phosphorus concentration is $x$ and the arsenic concentration $(1-x)$, where $0.3 \leq x \leq 0.5$, said junction region having an energy band gap of $y$, and said junction region being capable of emitting electromagnetic radiation;

a graded region of varying composition having upper and lower surfaces, at said upper surface being substantially the composition of the junction region and contiguous therewith, any given plane in said graded region disposed substantially parallel to the upper surface having an energy band gap of $z$, where $z \geq y$;

a transparent substrate region of semiconductor material having an upper and lower surface, said upper surface being contiguous with the lower surface of the graded region, and said substrate being substantially the composition of the lower surface of the graded region, and wherein the band gap of the transparent substrate region is $w$, where $w > y$ and therefore essentially transparent to electromagnetic radiation emitted by said junction;

a material reflective to the electromagnetic radiation emitted by the junction region, said reflective material being disposed on the surface of the transparent substrate region which is opposite the graded region; and contact means for applying electrical signals to the junction of the electroluminescent semiconductor.

2. Apparatus as in claim 1 wherein the substrate region is gallium arsenide phosphide wherein the phosphorus concentration is $x$ and the arsenic concentration is $(1-x)$, where $x \geq 0.5$.

3. Apparatus as in claim 2 wherein $x = 1.0$.

4. Apparatus as in claim 1 wherein the junction region is included within a mesa shaped protrusion contiguous with the graded region.

5. Apparatus as in claim 1 wherein the composition of the graded region varies continuously from its upper surface to its lower surface.

6. Apparatus as in claim 1 wherein the composition of the graded region varies in discrete steps from its upper surface to its lower surface.

* * * * *